(12) United States Patent
Khoury et al.

(10) Patent No.: US 6,441,629 B1
(45) Date of Patent: Aug. 27, 2002

(54) PROBE CONTACT SYSTEM HAVING PLANARITY ADJUSTMENT MECHANISM

(75) Inventors: Theodore A. Khoury, Evanston; Robert Edward Aldaz, Carol Stream, both of IL (US)

(73) Assignee: Advantest Corp, Tokyo (JP)

( * ) Notice: Subject to any disclaimer, the term of this patent is extended or adjusted under 35 U.S.C. 154(b) by 0 days.

(21) Appl. No.: 09/583,837

(22) Filed: May 31, 2000

(51) Int. Cl.[7] .............................................. G01R 31/02
(52) U.S. Cl. ...................... 324/757; 324/754; 324/758; 118/620
(58) Field of Search ............................. 324/158.1, 757, 324/758, 765, 754, 755, 756, 761, 762; 118/620; 209/573, 111.8; 414/416, 716

(56) References Cited

U.S. PATENT DOCUMENTS

| | | | |
|---|---|---|---|
| 5,084,671 A | * | 1/1992 | Miyata |
| 5,506,498 A | * | 4/1996 | Anderson |
| 5,804,983 A | * | 9/1998 | Nakajima |
| 5,806,181 A | | 9/1998 | Khandros et al. |
| 5,861,759 A | | 1/1999 | Bialobrodski et al. |
| 5,974,662 A | | 11/1999 | Eldridge et al. |
| 6,043,668 A | * | 3/2000 | Carney |
| 6,050,829 A | | 4/2000 | Eldridge et al. |

* cited by examiner

*Primary Examiner*—Michael J. Sherry
*Assistant Examiner*—Trung Nguyen
(74) *Attorney, Agent, or Firm*—Muramatsu & Associates (57) ABSTRACT

A probe contact system is capable of adjusting distances between tips of the contactors and contact targets with simple and low cost mechanism. The planarity adjustment mechanism includes a contact substrate having a plurality of contactors mounted on a surface thereof, a probe card for establishing electrical communication between the contactors and a semiconductor test system, a conductive elastomer provided between the contact substrate and the probe card, connection members for connecting the contact substrate and the probe card at three locations on the contact substrate where each of the connection members is adjustable for changing a distance between the contact substrate and the probe card, a gap sensor for measuring a gap between the contact substrate and a semiconductor wafer, and a rotation adjustment device for rotating the connection member.

17 Claims, 9 Drawing Sheets

Fig. 9A 221a
221 Tob Knob
221b

Fig. 9B

232 Springs

Fig. 9C

233 Plungers

Fig. 9D 235
235
222 Lower Knob

Fig. 9E 237
234 Top Retaining Ring

Fig. 9F 236
236
223 Knob Base
252

Fig. 9G

238 Lower Retaining Ring

Fig. 11

PROBE CONTACT SYSTEM HAVING PLANARITY ADJUSTMENT MECHANISM

FIELD OF THE INVENTION

This invention relates to a semiconductor test system having a large number of contactors for establishing electrical connection with a semiconductor device under test, and more particularly, to a probe contact system having a planarity adjustment mechanism for adjusting distances between tips of the contactors and contact targets such as contact pads of the semiconductor wafer to be tested.

BACKGROUND OF THE INVENTION

In testing high density and high speed electrical devices such as LSI and VLSI circuits, a high performance contact structure provided on a probe card must be used. A contact structure is basically formed of a contact substrate having a large number of contactors or probe elements. The contact substrate is mounted on a probe card for testing LSI and VLSI chips, semiconductor wafers, burn-in of semiconductor wafers and dice, testing and burn-in of packaged semiconductor devices, printed circuit boards and the like.

Figure 1:
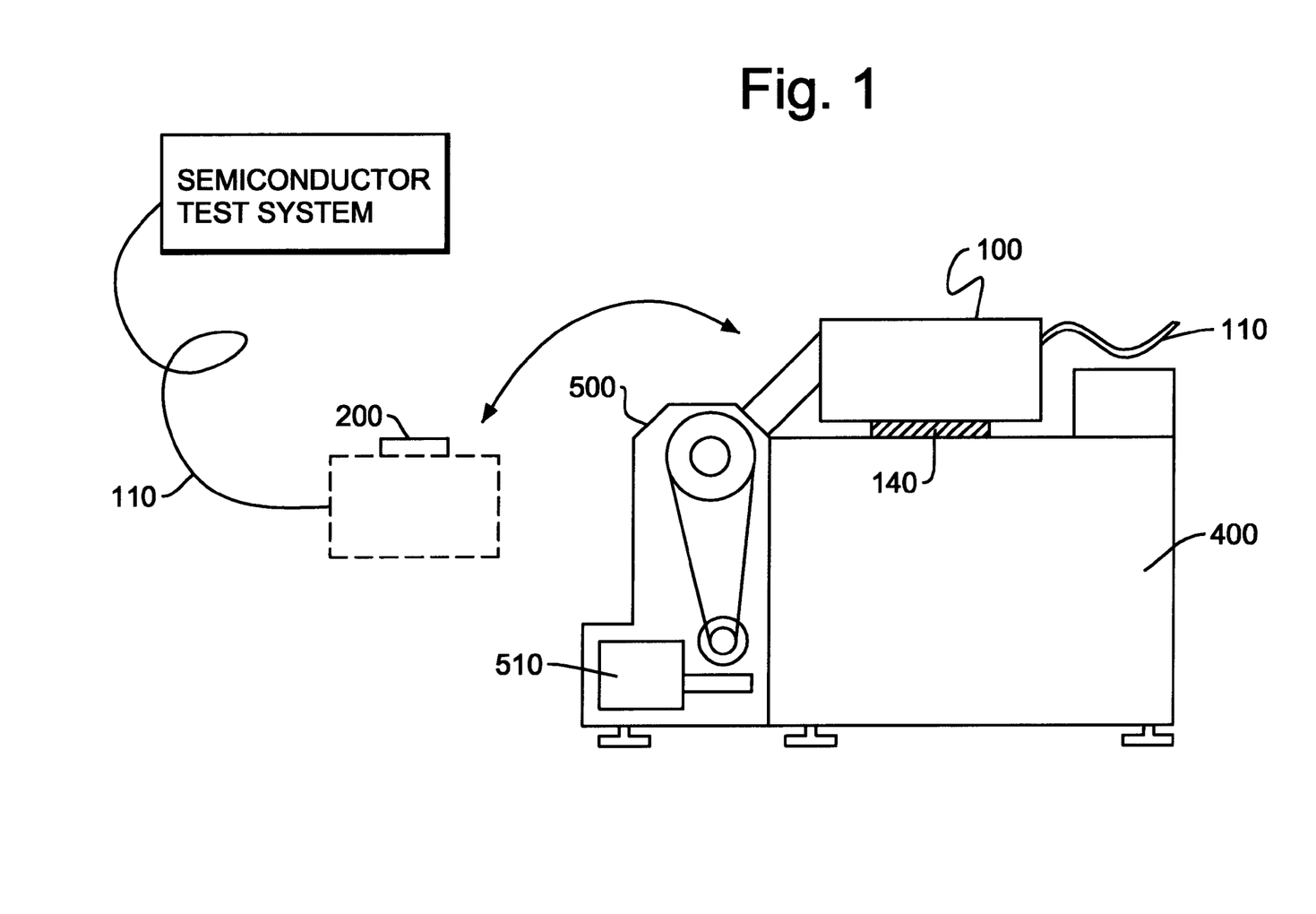
FIG. 1 is a schematic diagram showing a structural relationship between a substrate handler and a semiconductor test system having a test head.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals are compared with expected data to determine whether the IC circuits on the semiconductor wafer function correctly or not.

Figure 2:
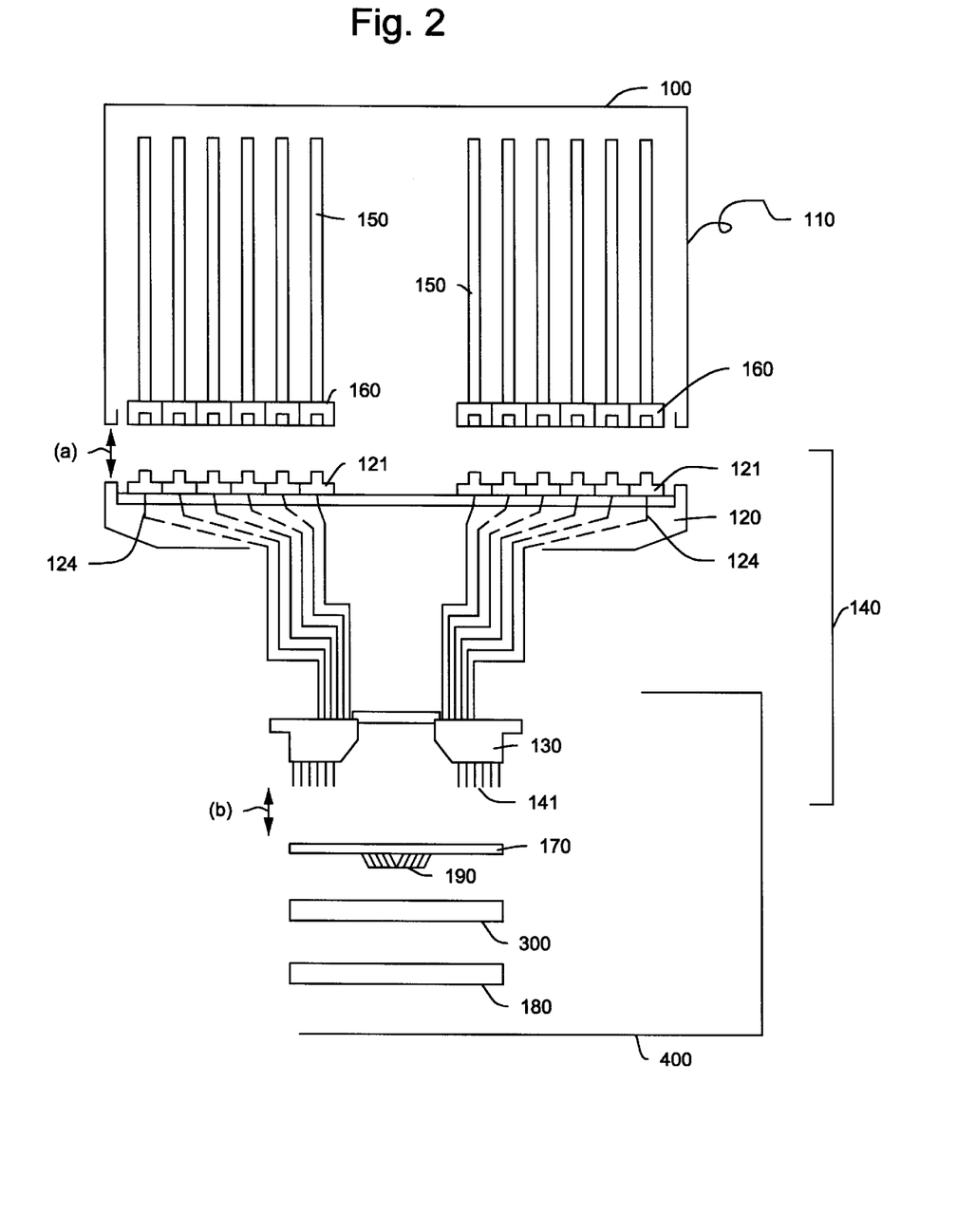
FIG. 2 is a diagram showing an example of detailed structure for connecting the test head of the semiconductor test system to the substrate handler.

In FIG. 1, the test head 100 and the substrate handler 400 are connected through an interface component 140 consisting of a performance board 120 (shown in FIG. 2) which is a printed circuit board having electric circuit connections unique to a test head's electrical footprint, coaxial cables, pogo-pins and connectors. In FIG. 2, the test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120. A "frog" ring 130 is mounted on the performance board 120 to accurately determine the contact position relative to the substrate handler 400. The frog ring 130 has a large number of contact pins 141, such as ZIF connectors or pogopins, connected to contact terminals 121, through coaxial cables 124.

As shown in FIG. 2, the test head 100 is placed over the substrate handler 400 and mechanically and electrically connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or contact pads in the IC circuit on the semiconductor wafer 300 under test.

Electrical terminals or contact receptacles (contact pads) of the probe card 170 are electrically connected to the contact pins 141 provided on the frog ring 130. The contact pins 141 are also connected to the contact terminals 121 of the performance board 120 with the coaxial cables 124 where each contact terminal 121 is connected to the printed circuit board 150 of the test head 100. Further, the printed circuit boards 150 are connected to the semiconductor test system through the cable 110 having, for example, several hundreds of inner cables.

Under this arrangement, the probe contactors 190 contact the surface (contact targets) of the semiconductor wafer 300 on the chuck 180 to apply test signals to the semiconductor wafer 300 and receive the resultant output signals from the wafer 300. The resultant output signals from the semiconductor wafer 300 under test are compared with the expected data generated by the semiconductor test system to determine whether the IC circuits on the semiconductor wafer 300 performs properly.

A large number of contactors must be used in this type of semiconductor wafer test, such as from several hundreds to several thousands. In such an arrangement, it is necessary to planarize the tips of the contactors so that all of the contactors contact the contact targets at substantially the same time and same pressure. If planarization is not achieved, some contactors establish electrical connections with corresponding contact targets while other contactors fail to establish electrical connections, which is impossible to accurately test the semiconductor wafer. To completely connect all of the contactors to the contact targets, the semiconductor wafer must be further pressed against the probe card. This may physically damage semiconductor dies which receive excessive pressure by contactors.

U.S. Pat. No. 5,861,759 shows an automatic probe card planarization system to planarize a first plane defined by a plurality of contact points of a probe card and relative to a second plane defined by a top surface of a semiconductor wafer supported on a prober. A camera is used to measure the height of at least three selected contact points on the probe card relative to the plane of wafer. Based on the measured values, the position of the first plane relative to the second plane is calculated.

With that information and the geometry of the prober and tester, the height variations necessary for the two height variable points are made to planarize the first plane relative to the second plane. This conventional technology requires a camera for visualizing the height of the contact points, resulting in increase in cost and decrease in reliability of the overall system.

U.S. Pat. No. 5,974,662 shows a method of planarizing tips of probe elements of a probe card assembly. The probe elements are mounted directly on a space transformer (contact substrate). It is so configured that the orientation of the space transformer, and thus the orientation of the probe elements, can be adjusted without changing the orientation of the probe card. In this method, an electrically conductive metal plate (virtual wafer) is provided in stead of the target semiconductor wafer as a reference plane. A cable and a computer are also provided in such a way that a computer display shows whether a conductive path is created or not for each probe tip relative to the metal plate by for example, white and black dots.

Based on the visual image on the display, the planarity of the probe tips is adjusted by rotating differential screws so that all of the probe tips make substantially simultaneous contact with the metal plate. Because this conventional technology uses a conductive metal plate to establish conductive path for all of probe elements, it requires an extra time to mount the metal plate and replace the same with the target semiconductor wafer. Further, because this method needs a computer and a display to illustrate the states of contact or non-contact of the probe element, an overall cost has to be increased.

Under the circumstances, there is a need in the industry to incorporate a more simple and economical way in a probe contact system to adjust the planarity of the contactors with respect to the surface of the semiconductor wafer.

SUMMARY OF THE INVENTION

Therefore, it is an object of the present invention to provide a probe contact system having a planarity adjustment mechanism for adjusting distances between tips of contactors and a surface of a semiconductor wafer under test.

It is another object of the present invention to provide a probe contact system having a planarity adjustment mechanism and a contact structure mounted on a probe card wherein the contact structure is formed of a contact substrate and a large number of contactors mounted on the contact substrate.

It is a further object of the present invention to provide a probe contact system having a planarity adjustment mechanism for adjusting distances between a contact substrate and a semiconductor wafer under test so that all of contactors on the contact substrate contact the surface of the semiconductor wafer at the same time.

It is a further object of the present invention to provide a probe contact system having a planarity adjustment mechanism for adjusting distances between a contact substrate and a semiconductor wafer under test so that each contactor exerts an identical pressure against the surface of the semiconductor wafer when brought into contact with the semiconductor wafer.

In the present invention, a planarity adjustment mechanism for a probe contact system for establishing electrical connection with contact targets includes a contact substrate having a large number of contactors mounted on a surface thereof, a probe card for establishing electrical communication between the contactors and a test head of a semiconductor test system, a conductive elastomer provided between the contact substrate and the probe card, connection members for connecting the contact substrate and the probe card at three locations on the contact substrate where each of the connection members is rotatable for changing a distance between the contact substrate and the probe card, a gap sensor for measuring a gap between the contact substrate and a semiconductor wafer or reference plate (target substrate) in the vicinity of each of the three locations of the contact substrate, and a rotation adjustment device for rotating the connection member so that the gap between the contact substrate and the semiconductor wafer at each of the three locations becomes identical to one another.

In another aspect of the present invention, the connection member for connecting the contact substrate and the probe card is configured by bolts and nuts, and the nuts are rotatably supported on the surface of the probe card, and the rotation adjustment device having a bottom opening which engages with the nut is placed on the surface of the probe card for rotating the nuts so that the gap between the contact substrate and the target substrate at each of the three locations becomes identical to one another.

In a further aspect of the present invention, the planarity adjustment mechanism is an automatic system for adjusting distances between the contact substrate and the target substrate. The adjustment mechanism includes motors for rotating the nuts based on control signals from a controller. The controller produces the control signals by calculating the measured gaps.

DETAILED DESCRIPTION OF THE PREFERRED EMBODIMENT

An example of contact structure to be used in the probe contact system of the present invention will be described with reference to FIGS. 3 and 4. Many other different types of contact structures are also feasible in the probe contact system of the present invention. A contact structure 10 of FIG. 3 has beam like (silicon finger) contactors 30 produced through a semiconductor production process. The contact structure 10 is basically formed of a contact substrate 20 and the silicon finger contactors 30. The contact structure 10 is so positioned over contact targets such as contact pads 320 on a semiconductor wafer 300 to be tested that the contactors 30 establish electric connections with the semiconductor wafer 300 when pressed with each other. Although only two contactors 30 are shown in FIG. 3, a large number, such as from several hundreds to several thousands, of contactors 30 are aligned on the contact substrate 20 in actual applications such as semiconductor wafer testing.

Such a large number of contactors are produced through the same semiconductor production process such as a photolithography process on a silicon substrate and mounted on the contact substrate 20 made, for example of ceramic. The pitch between the contact pads 320 may be as small as 50 $\mu$m or less wherein the contactors 30 on the contact substrate 20 can easily be aligned in the same pitch since they are made through the same semiconductor production process as the wafer 300 are made.

Figure 3:
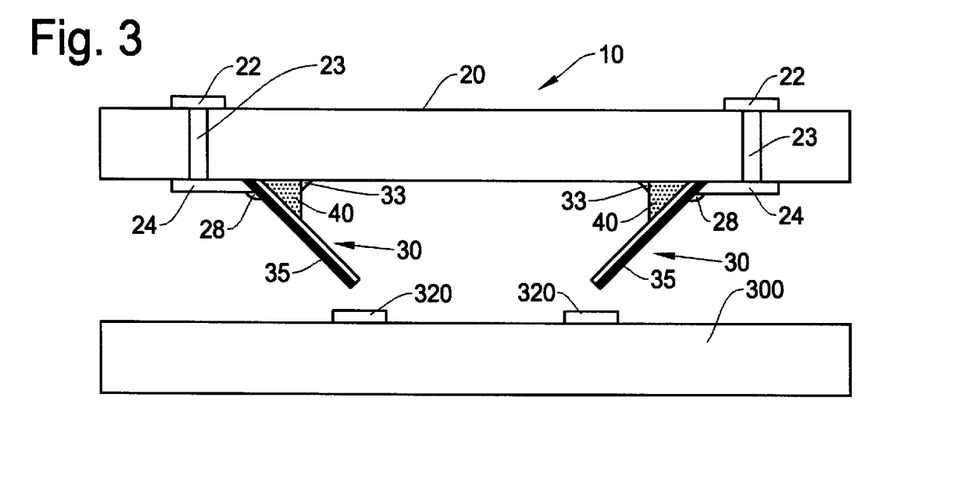
FIG. 3 is a cross sectional view showing an example of contact structure having beam like (silicon finger) contactors to be mounted on a probe card of the probe contact system of the present invention.
Figure 4:
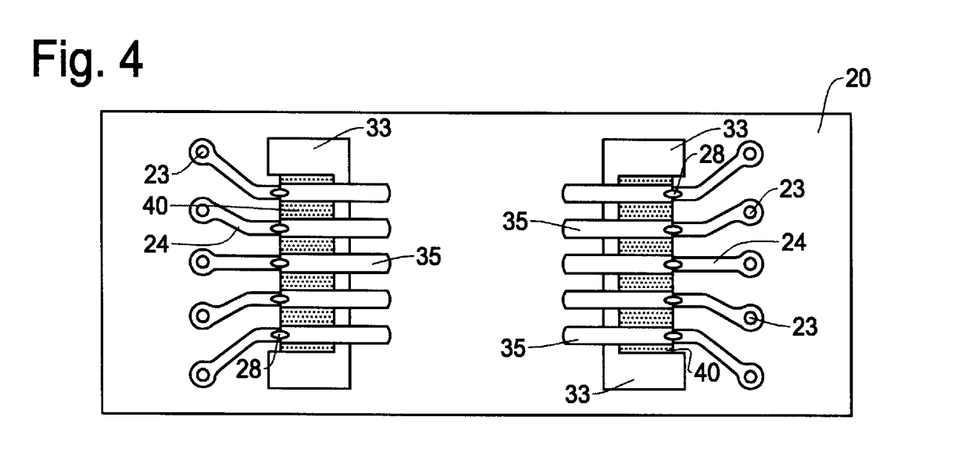
FIG. 4 is a schematic diagram showing a bottom view of the contact structure of FIG. 3 having a plurality of beam like contactors.

The silicon finger contactors 30 can be directly mounted on the contact substrate 20 as shown in FIGS. 3 and 4 to form a contact structure which can then be mounted on the probe card 170 of FIG. 2. Since the silicon finger contactors 30 can be fabricated in a very small size, an operable frequency range of a contact structure or probe card mounting the contactors of the present invention can be easily increased to 2 GHz or higher. Because of the small size, the number of contactors on a probe card can be increased to as many as, for example 2,000 or more, which is able to test as many as 32 or more memory devices in parallel at the same time.

In FIG. 3, each of the contactors 30 has a conductive layer 35 in a finger (beam) like shape. The contactor 30 also has a base 40 which is attached to the contact substrate 20. An interconnect trace 24 is connected to the conductive layer 35 at the bottom of the contact substrate 20. Such a connection between the interconnect trace 24 and the conductive layer 35 is made, for example, through a solder ball 28. The contact substrate 20 further includes a via hole 23 and an electrode 22. The electrode 22 is to interconnect the contact substrate 20 to an external structure such as a pogo-pin block or an IC package through a wire or a conductive elastomer.

Thus, when the semiconductor wafer 300 moves upward, the silicon finger contactors 30 and the contact targets 320 on the wafer 300 mechanically and electrically contact with each other. Consequently, a signal path is established from the contact target 320 to the electrodes 22 on the contact substrate 20. The interconnect trace 24, the via hole 23 and the electrode 22 also function to fan-out the small pitch of the contactors 30 to a larger pitch to fit to the external structure such as a pogo-pin block or an IC package.

Because of the spring force of the beam like shape of the silicon finger contactors 30, the end of the conductive layer 35 produces a sufficient contact force when the semiconductor wafer 300 is pressed against the contact substrate 20. The end of the conductive layer 35 is preferably sharpened to achieve a scrubbing effect when pressed against the contact target 320 for penetrating through a metal-oxide layer.

For example, if the target 320 on the semiconductor wafer 300 has aluminum oxide on its surface, the scrubbing effect is necessary to establish an electrical connection with low contact resistance. The spring force derived from the beam like shape of the contactor 30 provides an appropriate contact force against the contact target 320. The elasticity produced by the spring force of the silicon finger contactor 30 also functions to compensate the differences in size or flatness (planarity) involved in the contact substrate 20, the contact target 320 and the wafer 300, as well as the contactors 30. However, it is still necessary to incorporate a planarity adjustment mechanism of the present invention to fully connect all of the contactors to the contact targets at substantially the same time and same pressure.

An example of material of the conductive layer 35 includes nickel, aluminum, copper, nickel palladium, rhodium, nickel gold, iridium or several other depositable materials. An example of size of the silicon finger contactor 30 intended for a semiconductor test application may be 100–500 $\mu$m in overall height, 100–600 $\mu$m in horizontal length, and about 30–50 $\mu$m in width for the pitch of 50 $\mu$m or more between contact targets 320.

FIG. 4 is a bottom view of the contact substrate 20 of FIG. 3 having a plurality of silicon finger contactors 30. In an actual system, a larger number of contactors, such as several hundreds of them, will be aligned in the manner shown in FIG. 4. The interconnect traces 24 expand the pitch of the contactors 30 to the pitch of the via holes 23 and electrodes 22 as shown in FIG. 4. Adhesives 33 are provided at contact points (inner areas of contactors 30) between the substrate 20 and the bases 40 of the contactors 30. The adhesives 33 are also provided at the sides (top and bottom of contactors 30 in FIG. 4) of the set of contactors 30. An example of adhesives 33 includes thermosetting adhesives such as epoxies, polyimide and silicone, and thermoplastic adhesives such as acrylic, nylon, phenoxy and olefin, and UV cured adhesives.

Figure 5:
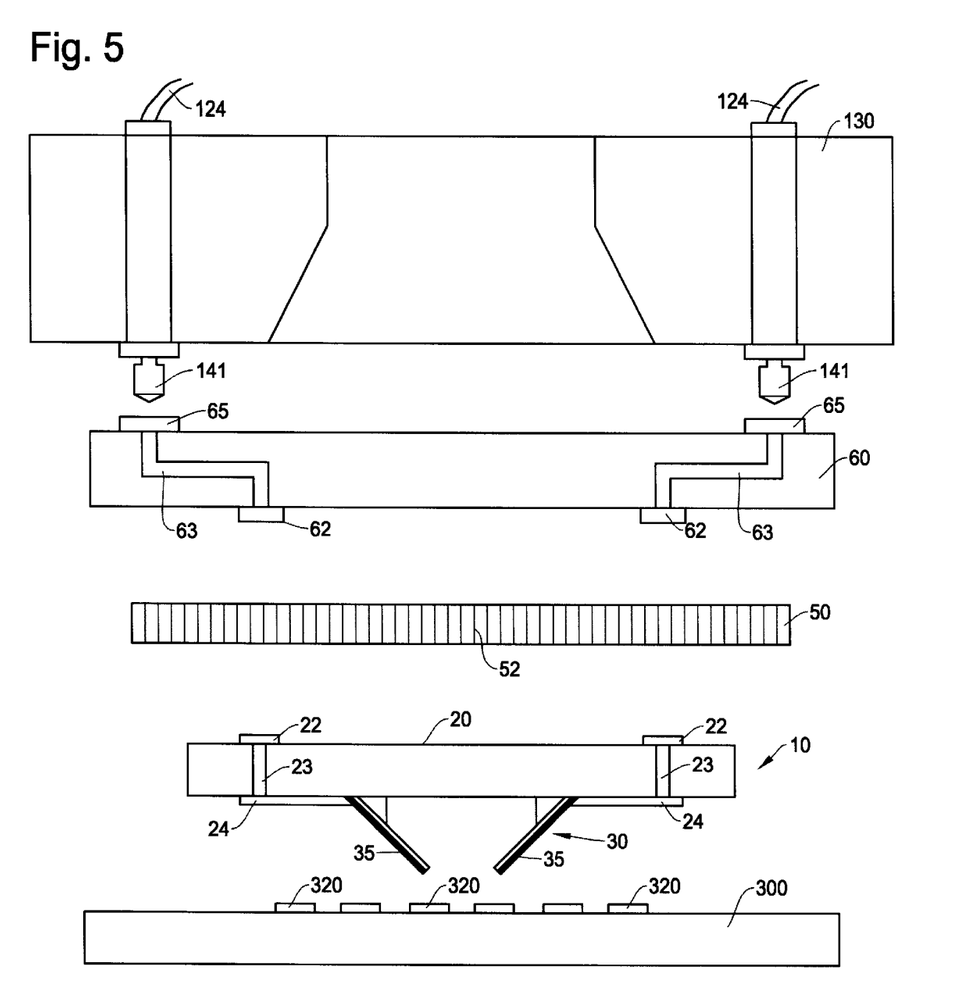
FIG. 5 is a cross sectional view showing an example of total stack-up structure in a probe contact system using the contact structure of FIGS. 3 and 4 as an interface between the semiconductor device under test and the test head of FIG. 2.

FIG. 5 is a cross sectional view showing an example of total stack-up structure forming a probe contact system using the contact structure of FIGS. 3 and 4. The probe contact system will be used as an interface between the semiconductor device under test and the test head of FIG. 2. In this example, the interface assembly includes a conductive elastomer 50, a probe card 60, and a pogo-pin block (frog ring) 130 provided over the contact structure 10 in the order shown in FIG. 5.

The conductive elastomer 50, probe card 60 and pogo-pin block 130 are mechanically as well as electronically connected with one another. Thus, electrical paths are created from the tip of the contactors 30 to the test head 100 through the cables 124 and performance board 120 (FIG. 2). Thus, when the semiconductor wafer 300 and the probe contact system are pressed with each other, electrical communication will be established between the device under test (contact pads 320 on the wafer 300) and the semiconductor test system.

The pogo-pin block (frog ring) 130 is equivalent to the one shown in FIG. 2 having a large number of pogo-pins to interface between the probe card 60 and the performance board 120. At upper ends of the pogo-pins, cables 124 such as coaxial cables are connected to transmits signals to printed circuit boards (pin electronics cards) 150 in the test head 100 in FIG. 2 through the performance board 120. The probe card 60 has a large number of contact pads or electrodes 62 and 65 on the upper and lower surfaces thereof. The electrodes 62 and 65 are connected through interconnect traces 63 to fan-out the pitch of the contact structure to meet the pitch of the pogo-pins in the pogo-pin block 130.

The conductive elastomer 50 is provided between the contact structure 10 and the probe card 60. The conductive elastomer 50 is to ensure electrical communications between the electrodes 22 of the contact structure and the electrodes 62 of the probe card by compensating unevenness or vertical gaps therebetween. The conductive elastomer 50 is an elastic sheet having a large number of conductive wires in a vertical direction. For example, the conductive elastomer 50 is comprised of a silicon rubber sheet and a multiple rows of metal filaments. The metal filaments (wires) are provided in the vertical direction of FIG. 5, i.e., orthogonal to the horizontal sheet of the conductive elastomer 50. An example of pitch between the metal filaments is 0.02 mm with thickness of the silicon rubber sheet is 0.2 mm. Such a conductive elastomer is produced by Shin-Etsu Polymer Co. Ltd and available in the market.

Figure 6:
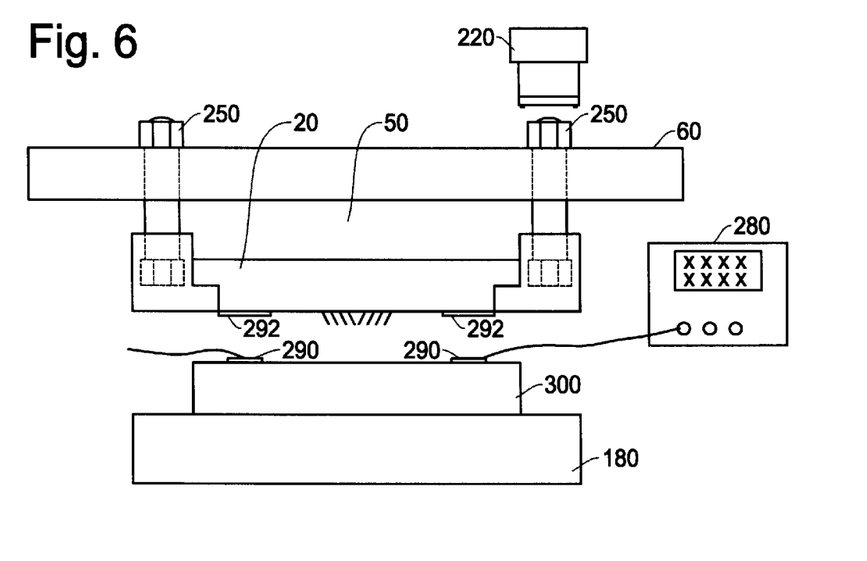
FIG. 6 is a cross sectional view showing an example of structure of a probe contact system having a planarity adjustment mechanism of the present invention.

FIG. 6 is a cross sectional view showing an example of structure of a probe contact system having a planarity adjustment mechanism of the present invention. The contact substrate 20 having a plurality of contactors 30 is mounted on the probe card 60 through a support frame 55 and a conductive elastomer 50. The support frame 55 for supporting the contact substrate 20 is connected to the probe card 60 by fastening means (a connection member) such as bolts 252 and nuts 250. Such connection by the nuts and bolts is made at three points, for example at each apex of a regular triangle. Instead of bolts and nuts, other fastening means such as differential screws may be used for performing the same function. As described with reference to FIG. 5, the conductive elastomer 50 establishes electrical conductivity only in the vertical direction, i.e., between the contact substrate 20 and the probe card 60.

On the bottom surface of the contact substrate 20, electrodes 292 are provided in the vicinity of the bolts 252 connected to the support frame 55. Alternatively, the electrodes 292 may be formed on the bottom surface of the support frame 55. A semiconductor wafer 300 to be tested is placed on a chuck 180 of a wafer prober. The example of FIG. 6 further shows gap sensors 290 on the semiconductor wafer 300 and a gap measurement instrument 280 which receives signals from the gap sensors 290 at input terminals 282. The gap sensors 290 are also electrodes and are placed on the surface of the wafer 300 at positions opposite to the electrodes 292 on the bottom surface of the contact substrate 20, i.e, at three locations thereon. Alternatively, a reference plate made of, for example, ceramic or alumina may be used in lieu of the customer wafer 300 so that the planarity of the probe contact system is adjusted prior to the shipment to customers.

A rotation adjustment device 220 is a specially made tool for rotating the nut 250 with fine steps. The rotation of the nuts 250 causes vertical movements of the bolt 252, thereby changing the parallelism between the probe card 60 and the contact substrate 20, and thus, between the contact substrate 20 and the semiconductor wafer 300. In other words, the rotation of the nuts 250 change a tile angle of the contact substrate 20 with respect to the probe card 60. In this arrangement, since the vertical positions of the contact substrate 20 are changed at the three locations where the bolts 252 are connected, the heights of the contactors 30 on the contact substrate 20 are adjusted to be flat relative to the surface of the semiconductor wafer 300.

For example, the gap sensor 292 is a capacitance sensor to measure capacitance between the sensor 290 and the opposite electrode 292. The measured capacitance value is a function of the distance between the sensor and electrode. An example of such gap sensors is a model HPT-500-V offered by Capacitec, Inc., 87 Fichburg Road, Ayer, Mass. By monitoring the gap between the sensor 290 and the electrode 292 measured by the gap measurement instrument 280, an operator rotates the nuts 250 by the adjustment device 220 in such a way that the gap at each of three locations becomes identical to one another.

Figure 7:
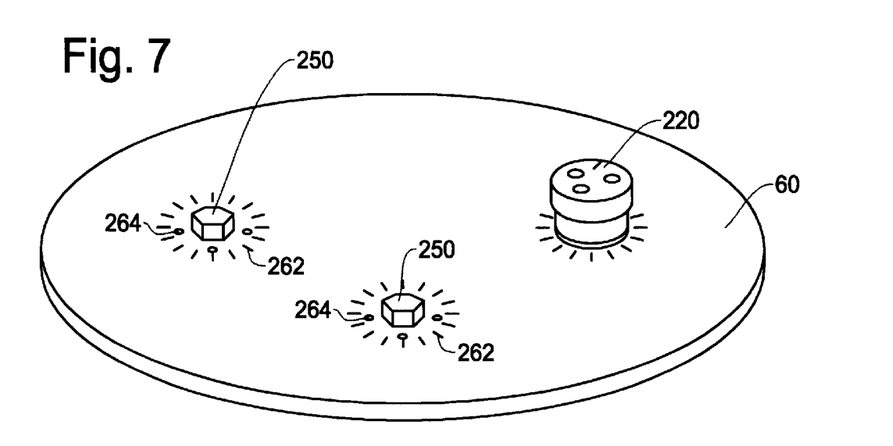
FIG. 7 is a perspective view showing an upper surface of the probe card in the probe contact system of the present invention having a rotation adjustment device.

FIG. 7 is a perspective view showing an upper surface of the probe card 60 in the probe contact system of the present invention. The rotation adjustment device 220 has an opening at the bottom (FIG. 8C) to fit with the nut 250 on the probe card 60. The probe card 60 has radial scales 262 or marks around the nuts 250 for easily observing the degree of rotation by the rotation adjustment device 220. The probe card 60 also has peg holes 264 to receive therein pegs 225 of the rotation adjustment device 220.

Figure 8A:
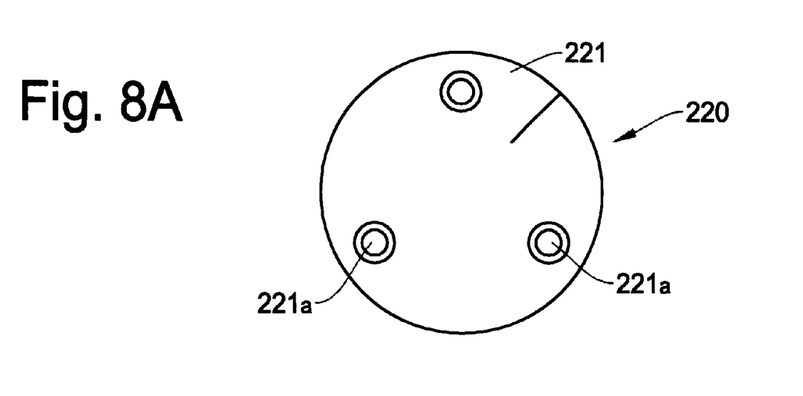
FIGS. 8A–8C are a top view, a front view and a bottom view, respectively, of the rotation adjustment device of the present invention.
Figure 8B:
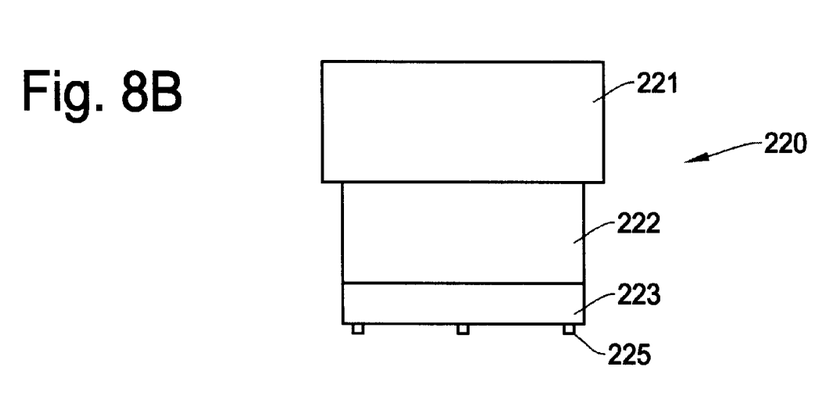
Figure 8C:
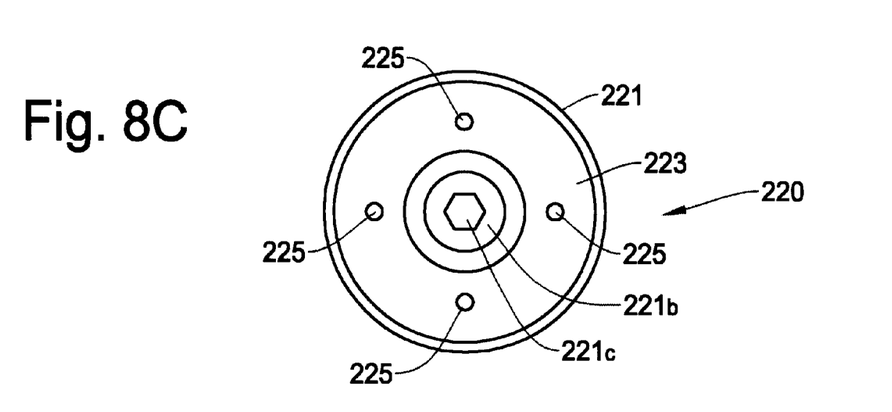

FIGS. 8A–8C show, respectively, a top view, a front view and a bottom view of the rotation adjustment device 220 of the present invention. As shown in FIG. 8B, the rotation adjustment device 220 is basically configured by a top knob 221, a lower knob 222, and a knob base 223. In FIG. 8A, the top knob 221 has a mark M on the top so that the operator knows the degree of rotation in combination with the radial scale 262 provided on the probe card. The top knob 221 and the lower knob 222 are fixed by, for example screws, through fastening holes 221a. Preferably, the side surface of the top knob 221 is provided with notches or gripping tapes.

As shown in FIGS. 8B and 8C, the knob base 223 and the lower knob 222 are rotatably connected with each other. The knob base 223 has pegs 225 at its bottom to be inserted in the peg holes 264 on the probe card 60. Thus, when in use, the knob base 223 stays on the probe card 60 while the top knob 221 and lower knob 222 rotate on the knob base 223 for adjusting the nut 250. The top knob 221 has a lower extended portion 221b having an opening 221c. The nut 250 fits in the opening 221c so that the nut 250 is rotated by the rotation of the top knob 221 and lower knob 222.

FIGS. 9A–9G show exploded views of the rotation adjustment device 220 of the present invention. The top knob 221 of FIG. 9A has the lower extended portion 221b which reaches the nut 250 on the probe card 60 when adjusting the planarity. The lower knob 222 of FIG. 9D has many retaining holes 235 to receive therein plungers 233 of FIG. 9C and springs 232 of FIG. 9B. Although not shown, the bottom of the retaining holes 235 are reduced in the diameter so that only the lower tips of the plungers 233 can be protruded from the bottom surface of the lower knob 222. The plungers 233 are made of low friction or lubricated plastic such as Acetel or Delin supplied by DuPont.

Figure 9A:
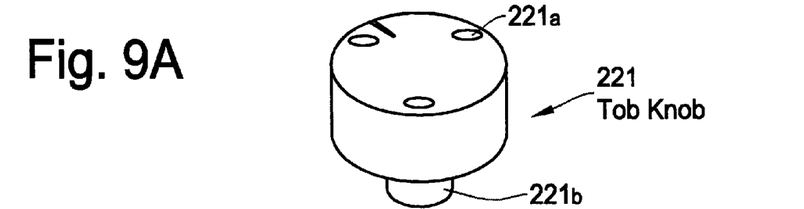
FIGS. 9A–9G are exploded views showing components and assembly thereof used in the rotation adjustment device of the present invention.
Figure 9B:
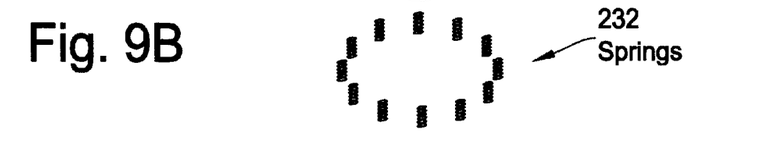
Figure 9C:
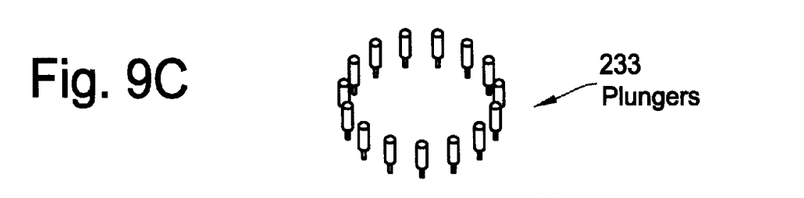
Figure 9D:
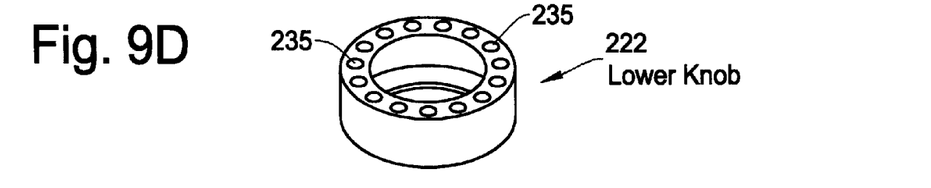
Figure 9E:
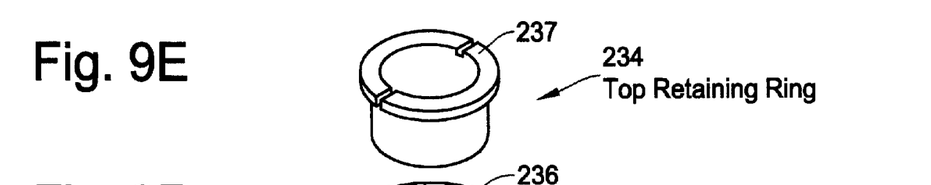
Figures 9F, 9G:
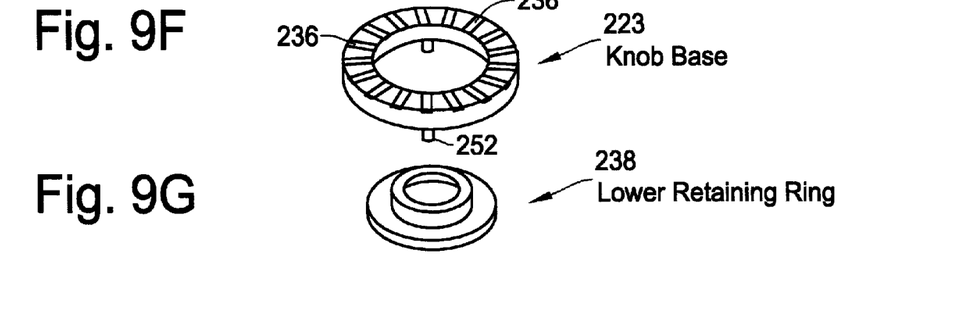

The knob base 223 of FIG. 9F has a large number of radial grooves 236 on the upper surface. When assembled, the lower tips of the plungers 233 engage in the grooves 236 by the downward force of the springs 232. The pitch of the retaining holes 235 on the lower knob 222 and the pitch of the radial grooves 236 on the knob base 223 are designed to be slightly different from each other. Thus, when rotating the nut 250, the rotation adjustment device 220 creates very small steps of rotation by engagement of the plungers 233 in the grooves 236 while giving clicks to an operator.

The knob base 223 is attached to the lower knob 222 by means of a top retaining ring 234 of FIG. 9E and a lower retaining ring 238 of FIG. 9G. The top retaining ring 234 with a flange 237 is inserted in the lower knob 222 from a top opening thereof and retained in the lower position of the lower knob 222. By connecting the top retaining ring 234 and the lower retaining ring 238 while sandwiching the knob base 223 between the lower knob 222 and the lower retaining ring 238, the knob base 223 is rotatably attached to the lower knob 222 and the top knob 221.

Figure 10:
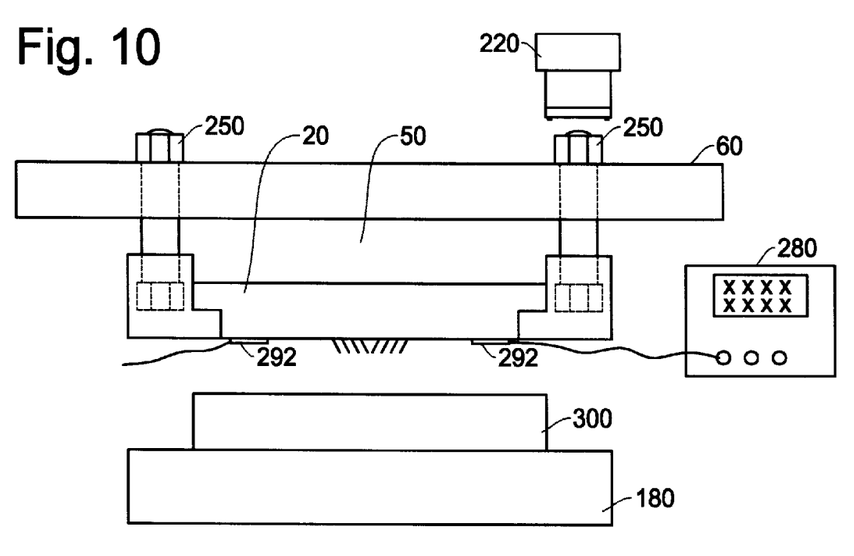
FIG. 10 is a cross sectional view showing another example of probe contact system having a planarity adjustment mechanism of the present invention.

FIG. 10 is a cross sectional view showing another example of the probe contact system of the present invention having a planarity adjustment mechanism. In this example, the gap sensor 290 is provided on the bottom surface of the contact substrate rather than the top surface of the semiconductor wafer in the example of FIG. 6. In this arrangement, since a semiconductor wafer has conductive patterns on its surface, specific electrodes may not be necessary for measuring the gaps. Similar to the example of FIG. 6, a reference plate made of ceramic or alumina having conductive pads at the three locations may be used in lieu of the customer wafer 300 so that the planarity adjustment is made prior to the shipment to customers.

Figure 11:
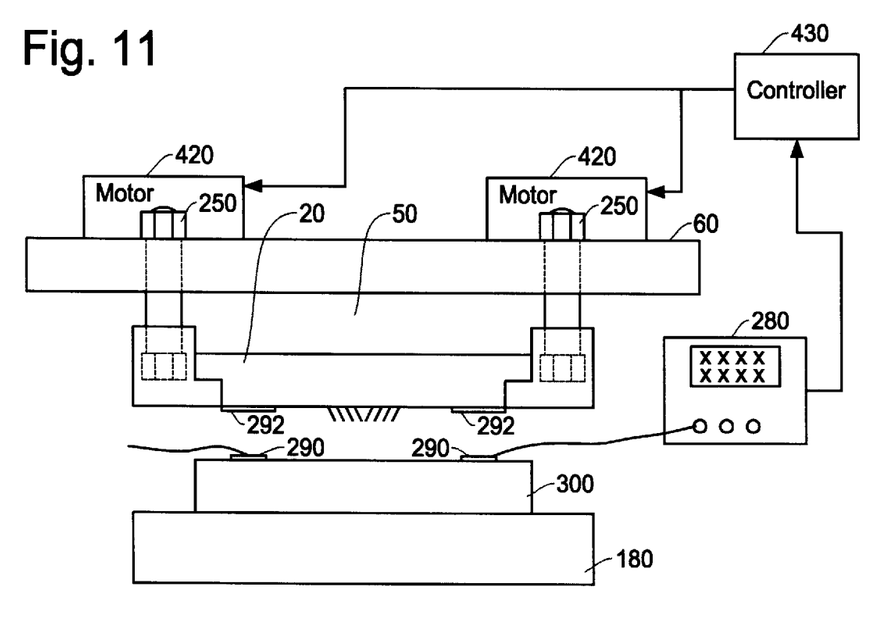
FIG. 11 is a cross sectional view showing a further example of probe contact system having a planarity adjustment mechanism of the present invention.

FIG. 11 is a cross sectional view showing a further example of the probe contact system of the present invention having a planarity adjustment mechanism. The planarity adjustment mechanism of this example is an automatic system for adjusting distances between the contact substrate and the semiconductor wafer or reference plate. The adjustment mechanism includes motors 420 for rotating the nuts 250 based on control signals from a controller 430. The controller 430 produces the control signals by calculating the measured gaps from the gap measurement instrument 280.

According to the present invention, the probe contact system is capable of adjusting the distances between tips of contactors and the surface of the semiconductor wafer under test or reference plate. The planarity adjustment mechanism is capable of adjusting the distances between the contact substrate and the semiconductor wafer so that all of contactors on the contact substrate contact the surface of the semiconductor wafer at substantially the same time with substantially the same pressure.

The planarity adjustment mechanism to be used in the probe contact system of the present invention includes the rotation adjustment device for rotating the nuts on the probe card with fine steps thereby adjusting the distances between the contact substrate and the semiconductor wafer easily and accurately. The planarity adjustment mechanism of the present invention can be configured as an automatic system by incorporating the motors for driving the nuts on the probe card and the controller generating control signals for the motors on the basis of the gaps measured by the gap sensors.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A planarity adjustment mechanism for a probe contact system for establishing electrical connection with contact targets, comprising:
   a contact substrate having a plurality of contactors mounted on a surface thereof;
   a probe card for establishing electrical communication between the contactors and a test head of a semiconductor test system;
   a conductive elastomer provided between the contact substrate and the probe card;
   a connection member for connecting the contact substrate and the probe card at three points on the contact substrate and probe card, said connection member changing an angle of the contact substrate relative to the probe card when it is driven;
   a gap sensor for measuring a gap between the contact substrate and a target substrate in a non-contact manner at three points on the contact substrate, said gap sensor being directly formed on the contact substrate; and
   a rotation adjustment device for driving said connection member to change said angle based on said gap measured by said gap sensor, thereby adjusting distance between the probe card and the contact substrate.

2. A planarity adjustment mechanism for a probe contact system as defined in claim 1, wherein said connection member for connecting the contact substrate and the probe card is configured by bolts and nuts.

3. A planarity adjustment mechanism for a probe contact system as defined in claim 1, wherein said connection member for connecting the contact substrate and the probe card is configured by differential screws.

4. A planarity adjustment mechanism for a probe contact system as defined in claim 1, wherein said gap sensor includes two opposing electrodes and determines the gap between the contact substrate and the target substrate by measuring capacitance between the two electrodes.

5. A planarity adjustment mechanism for a probe contact system as defined in claim 4, wherein one of said electrodes of said gap sensor is provided either on an upper surface of the target substrate or a bottom surface of the contact substrate.

6. A planarity adjustment mechanism for a probe contact system as defined in claim 1, wherein said target plate is either a semiconductor wafer having said contact targets or a reference plate specially prepared only for said planarity adjustment wherein said reference plate is made of a ceramic or alumina substrate having electrodes at positions opposite to the gap sensor.

7. A planarity adjustment mechanism for a probe contact system as defined in claim 1, wherein each of the three points on the contact substrate and probe card corresponds to an apex of a regular triangle.

8. A planarity adjustment mechanism for a probe contact system as defined in claim 1, wherein said connection member for connecting the contact substrate and the probe card is configured by bolts and nuts, said nuts being rotatably supported on the surface of the probe card, and wherein said rotation adjustment device has a bottom opening which engages with said nut on the surface of the probe card for rotating said nut in such a way that the gap between the contact substrate and the target substrate at each of the three locations becomes identical to one another.

9. A planarity adjustment mechanism for a probe contact system as defined in claim 8, wherein said rotation adjustment device is formed of a top knob, a lower knob and a knob base wherein the top knob and the lower knob are mechanically connected to each other while the lower knob and the knob base are rotatably attached to each other, and when driving the connection member, the knob base is fixedly engaged with the probe card while the top knob having a lower extended portion having the bottom opening rotates the nut to adjust the gap at each of the three locations.

10. A planarity adjustment mechanism for a probe contact system as defined in claim 9, wherein said lower knob of the rotation adjustment device is provided with a plurality of retaining holes for mounting therein plungers and springs in such a way that the lower tips of the plungers project from a bottom surface of the lower knob by resilience produced by the springs, and the base knob of the rotation adjustment device is provided with a plurality of radial grooves so that the lower tips of the plunger engages with the grooves when the upper and lower knobs are rotated, and wherein a pitch of the retaining holes and a pitch of the radial grooves are different from one another.

11. A planarity adjustment mechanism for a probe contact system as defined in claim 10, wherein said plungers are made of low friction plastic or lubricated plastic.

12. A planarity adjustment mechanism for a probe contact system as defined in claim 1, further comprising a support frame provided under the probe card for supporting the contact substrate wherein the connection member is extended between the probe card and the support frame.

13. A planarity adjustment mechanism for a probe contact system as defined in claim 1, wherein the conductive elastomer is comprised of a silicon rubber sheet and metal filaments running in a vertical direction in said silicon rubber sheet to establish electrical communication only in the vertical direction.

14. A planarity adjustment mechanism for a probe contact system for establishing electrical connection with contact targets, comprising:
- a contact substrate having a plurality of contactors mounted on a surface thereof;
- a probe card for establishing electrical communication between the contactors and a test head of a semiconductor test system;
- a conductive elastomer provided between the contact substrate and the probe card;
- a connection member for connecting the contact substrate and the probe card at three points on the contact substrate and probe card, said connection member changing an angle of the contact substrate relative to the probe card when it is driven;
- a gap sensor for measuring a gap between the contact substrate and the target substrate in a non-contact manner at three points on the contact substrate, said gap sensor being directly formed on the contact substrate;
- a controller for producing a control signal based on the gap measured by the gap sensor; and
- a motor for driving said connection member in response to the control signal from the controller to change said angle, thereby adjusting distance between the probe card and the contact substrate.

15. A planarity adjustment mechanism for a probe contact system as defined in claim 14, wherein said gap sensor includes two opposing electrodes and determines the gap between the contact substrate and the target substrate by measuring capacitance between the two electrodes.

16. A planarity adjustment mechanism for a probe contact system as defined in claim 15, wherein one of said electrodes of said gap sensor is provided either on an upper surface of the target substrate or a bottom surface of the contact substrate.

17. A planarity adjustment mechanism for a probe contact system as defined in claim 14, wherein said target plate is either a semiconductor wafer having said contact targets or a reference plate specially prepared only for said planarity adjustment wherein said reference plate is made of a ceramic or alumina substrate having electrodes at positions opposite to the gap sensor.

* * * * *